United States Patent
Lin et al.

(10) Patent No.: US 10,720,890 B1
(45) Date of Patent: Jul. 21, 2020

(54) HIGH-SPEED HIGH-ACCURACY AMPLIFIER AND METHOD THEREOF

(71) Applicant: Realtek Semiconductor Corp., Hsinchu (TW)

(72) Inventors: Chia-Liang (Leon) Lin, Fremont, CA (US); Chi-Kung (Richard) Kuan, Taoyuan County (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 32 days.

(21) Appl. No.: 16/273,200

(22) Filed: Feb. 12, 2019

(51) Int. Cl.
| | | |
|---|---|---|
| *H03F 3/04* | (2006.01) | |
| *H03F 1/30* | (2006.01) | |
| *H03F 3/26* | (2006.01) | |

(52) U.S. Cl.
CPC ............. *H03F 1/308* (2013.01); *H03F 3/04* (2013.01); *H03F 3/26* (2013.01)

(58) Field of Classification Search
CPC ... H03F 1/308; H03F 3/04; H03F 3/26; H03F 1/302; H03F 2200/18; H03F 1/301; H03F 1/0261; H03G 3/3042; H03G 3/3047
USPC .................................................. 330/285, 296
See application file for complete search history.

(56) References Cited

U.S. PATENT DOCUMENTS

| | | | |
|---|---|---|---|
| 7,057,444 B2 | 6/2006 | Illegems | |
| 8,072,270 B2 * | 12/2011 | Afsahi | H03F 1/0261 |
| | | | 330/269 |
| 8,816,774 B2 * | 8/2014 | Shinichi | H03F 1/223 |
| | | | 330/285 |
| 9,525,391 B2 | 12/2016 | Dasgupta et al. | |
| 10,291,194 B2 * | 5/2019 | Ilkov | H03F 3/193 |
| 2007/0090877 A1 | 4/2007 | Bagheri et al. | |
| 2011/0133842 A1 * | 6/2011 | Guerra | H03F 1/483 |
| | | | 330/288 |

OTHER PUBLICATIONS

TW Office Action dated Dec. 31, 2019 in Taiwan application (No. 108132133).

* cited by examiner

*Primary Examiner* — Khanh V Nguyen
(74) *Attorney, Agent, or Firm* — McClure, Qualey & Rodack, LLP

(57) ABSTRACT

A circuit includes a first current source of a first type, a common-source gain device, a load, a second current source of a second type, a first common-mode network, and a second common-mode network. The first current source pulls a first bias current from a source node according to a first bias voltage. The common-source gain device receives an input voltage and outputs an output current to a drain node according to the first bias current. The load provides a termination to the drain node. The second current source outputs a second bias current to the drain node according to a second bias voltage. The first common-mode network outputs the first bias voltage according to a constant-gm reference current. The second common-mode network outputs the second bias voltage according to a difference between a mean voltage at the drain node and a scaled reference voltage.

20 Claims, 5 Drawing Sheets

HIGH-SPEED HIGH-ACCURACY AMPLIFIER AND METHOD THEREOF

BACKGROUND OF THE DISCLOSURE

Field of the Invention

The present disclosure generally relates to amplifiers, and more particularly to an amplifier that can maintain both gain and available output swing stability through temperature changes.

Description of Related Art

As shown in FIG. 1A, a conventional high-speed amplifier 100 comprises: a current source 110 comprising two NMOS (n-channel metal oxide semiconductor) transistors 111$p$ and 111$n$ configured to pull two bias currents $I_{bp}$ an $I_{bn}$ from two source nodes 101$p$ and 101$n$, respectively, in accordance with a bias voltage $V_{bcm}$; a gain device 120, comprising two NMOS (n-channel metal oxide semiconductor) transistors 121$p$ and 121$n$ and two source-degenerating resistors 122$p$ and 122$n$, configured to receive two input voltages $V_{ip}$ and $V_{in}$ and output two output voltages $V_{op}$ and $V_{on}$ at two drain nodes 102$p$ and 102$n$ in accordance with a biasing condition determined by $I_{bp}$ an $I_{bn}$, respectively; and a load 130 comprising two pull-up resistors 131$p$ and 131$n$ configured to pull up the two drain nodes 102$p$ and 102$n$, respectively, to a power supply node "$V_{DD}$."

Functionally, amplifier 100 receives an input signal $V_i$, which is a differential signal comprising the two voltages $V_{ip}$ and $V_{in}$, and outputs an output signal $V_o$, which is a differential signal comprising the two voltages $V_{op}$ and $V_{on}$. The gain device 120 is based on "common-source" topology and configured to provide a gain in accordance with the two bias currents $I_{bp}$ an $I_{bn}$; here, the gain refers to a ratio of amplitude between $V_o$ and $V_i$. Amplifier 100 is well known in the prior art and therefore not explained in detail here.

Further, differential signaling is used, wherein a signal comprises two voltages denoted with two suffixes "p" and "n," respectively; for instance, $V_i$ comprises two voltages $V_{ip}$ and $V_{in}$, while $V_o$ comprises two voltages $V_{op}$ and $V_{on}$. Amplifier 100 comprises two halves, including a first half wherein all voltages, currents, components, and nodes are denoted with a suffix "p," and a second half wherein all voltages, currents, components and nodes are denoted with a suffix "n." The two halves are nominally identical and perform the same function, except that the first half receives $V_{ip}$ and output $V_{op}$ while the second half receives $V_{in}$ and output $V_{on}$. Besides, there are two nodes labeled by "101$cm$" and "102$cm$" that are shared by the two halves; such nodes are known as a "common-mode" node and denoted with a suffix "cm." Also, bias voltage $V_{bcm}$ is shared by the two halves, and that is why it is labeled with the suffix "cm." Since the two halves are identical, it is convenient to represent them with only one half and remove the suffixes "p" and "n" but retain the suffix "cm," resulting in amplifier 100$h$, depicted in FIG. 1B, that is a half-circuit representation of amplifier 100 of FIG. 1A.

In a half-circuit functional description, amplifier 100$h$ comprises: a current source 110$h$ comprising a NMOS transistor 111 configured to pull a bias current $I_b$ from a source node 101 in accordance with a bias voltage $V_{bcm}$; a gain device 120$h$, comprising NMOS transistor 121 and source-degenerating resistor 122, configured to receive $V_i$ and output $V_o$ at a drain node 102 in accordance with $I_b$; and a load 130$h$ comprising a pull-up resistor 131 configured to pull up the drain node 102 to "$V_{DD}$" and thus providing a termination to the drain node 102.

There are two important properties regarding amplifier 100$h$: gain and available output swing. The gain is determined by a product of a transconductance of the common-source gain device 120$h$ and an impedance of the load 130$h$; the available output swing is determined by a difference between "$V_{DD}$" and a mean value of "$V_o$." It is highly desirable that amplifier 100$h$ can maintain substantially the same gain and available output swing even when a temperature of the circuit changes. Unfortunately, the transconductance of the gain device 120$h$ is usually highly temperature dependent, and can be reduced by a factor of two under the same bias current when the temperature rises from −40° C. to 125° C. To maintain the same gain, the bias current $I_b$ generally must be adjusted in accordance with the temperature. On the other hand, the available output swing will vary with the temperature if the bias current $I_b$ is adjusted to maintain the same gain.

What is desired is an amplifier that can maintain both the gain and the available output swing when the temperature changes.

BRIEF SUMMARY OF THIS INVENTION

In an embodiment, a circuit includes a first current source of a first type, a common-source gain device, a load, a second current source of a second type, a first common-mode network, and a second common-mode network. The first current source of a first type pulls a first bias current from a source node in accordance with a first bias voltage. The common-source gain device receives an input voltage and outputs an output current to a drain node in accordance with the first bias current output from the source node. The load provides a termination to the drain node. The second current source of a second type outputs a second bias current to the drain node in accordance with a second bias voltage. The first common-mode network outputs the first bias voltage in accordance with a constant-gm reference current. The second common-mode network outputs the second bias voltage in accordance with a difference between a mean value of a voltage at the drain node and a scaled reference voltage scaled from a bandgap reference voltage.

In an embodiment, a method includes the following steps: conducting a first bias current from a source node using a first current source of a first type in accordance with a first bias voltage; converting an input voltage into an output current delivered to a drain node using a common-source gain device in accordance with the first bias current outputted from the source node; terminating the drain node with a load; conducting a second bias current to the drain node using a second current source of a second type in accordance with a second bias voltage; adjusting the first bias voltage in accordance with a current-to-voltage conversion of a constant-gm reference current; generating a scaled reference voltage by scaling from a bandgap reference voltage; and adjusting the second bias voltage in accordance with a difference between the scaled reference voltage and a mean value of a voltage at the drain node.

BRIEF DESCRIPTION OF THE DRAWINGS

Various aspects of the disclosure can be better understood with reference to the following drawings. The components in the drawings are not necessarily to scale, with emphasis instead being placed upon clearly illustrating the principles of the present disclosure. Moreover, in the drawings, like reference numerals designate corresponding parts throughout the several views.

DETAILED DESCRIPTION OF THIS DISCLOSURE

The present disclosure relates to amplifiers. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Persons of ordinary skill in the art understand terms and basic concepts related to microelectronics that are used in this disclosure, such as "(circuit) node," "signal," "voltage," "current," "transconductance," "amplifier," "differential signal," "common-mode," "current mirror," "bandgap voltage reference," "constant-gm current," "bias," "capacitor," "capacitance," "resistor," "CMOS (complementary metal oxide semiconductor)," "PMOS (P-channel metal oxide semiconductor) transistor," "NMOS (N-channel metal oxide semiconductor) transistor," "channel length modulation," "impedance," "common-source amplifier," "cascode," "source degeneration," "operational amplifier," and "negative feedback." Terms and basic concepts like these will be understood by those of ordinary skill in the art and thus will not be explained in detail here. Those of ordinary skill in the art will also recognize symbols like those of PMOS transistor and NMOS transistor, and identify the "source," the "gate," and the "drain" terminals thereof.

The present disclosure is presented in an engineering sense. For instance, "X is equal to Y" means: "a difference between X and Y is smaller than a specified engineering tolerance." "X is substantially smaller than Y" means: "a ratio between X and Y is smaller than a specified engineering tolerance."

Figure 1A:
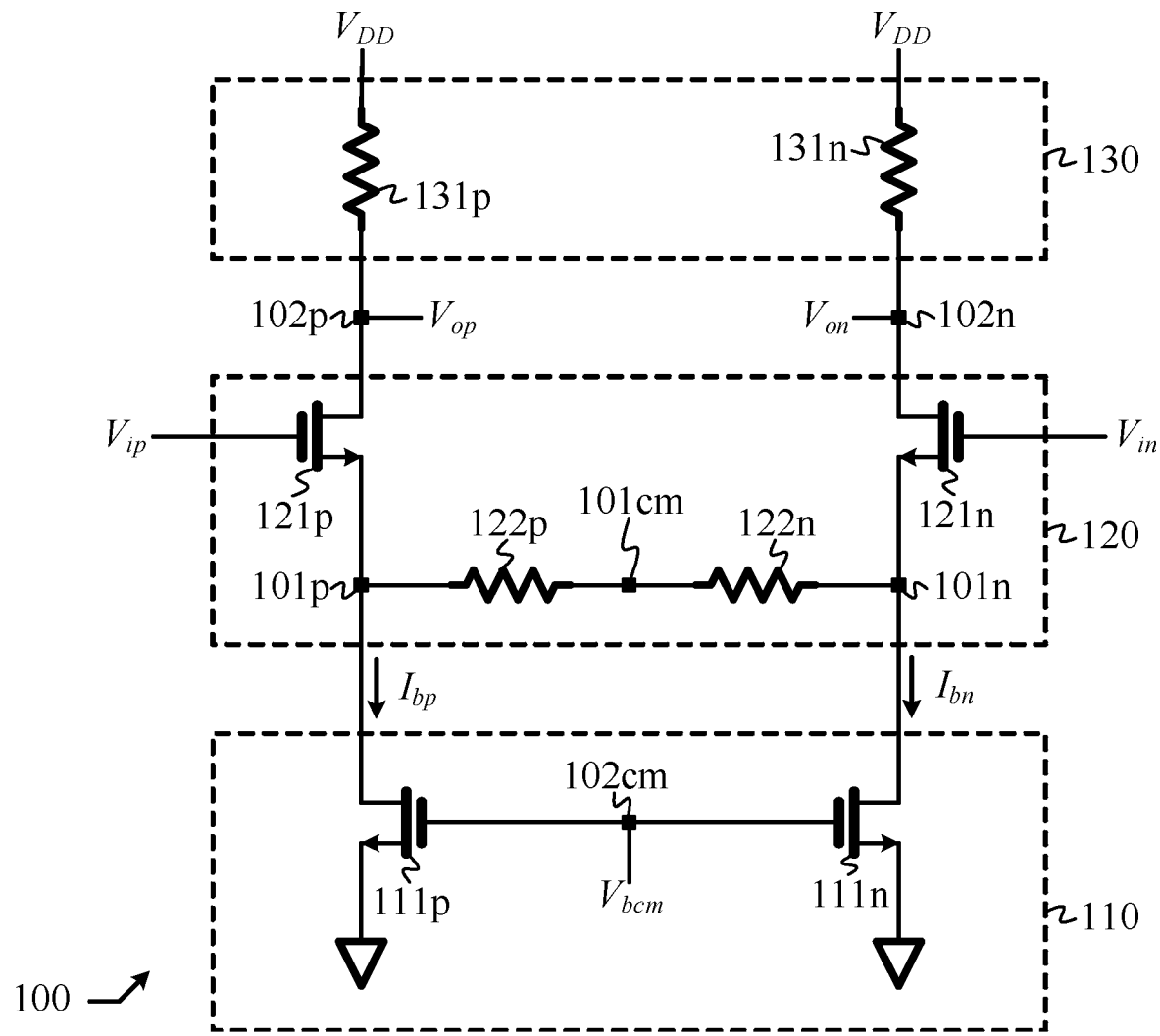
FIG. 1A shows a schematic diagram of a prior art amplifier.
Figure 1B:
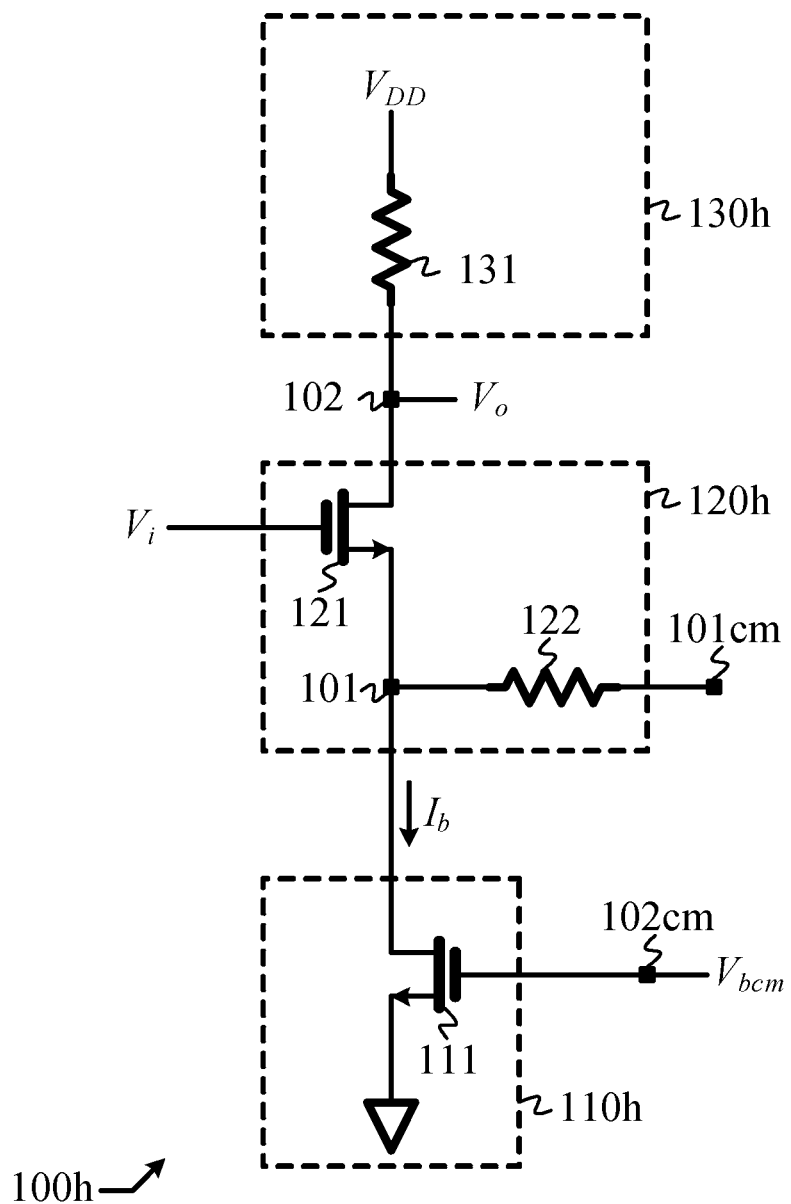
FIG. 1B shows a schematic diagram of a half-circuit representation of the amplifier of FIG. 1A.

Throughout this disclosure, differential signaling is used, wherein a voltage signal comprises a first voltage and a second voltage, while a current signal comprises a first current and a second current. Also, a differential circuit embodiment is used throughout this disclosure, wherein: a circuit embodiment comprises a first half, a second half, and a common-mode network that is shared by the first half and the second half; the first half and the second half are identical, except that they are processing a first part, voltage or current, and a second part, voltage or current, of the signal, respectively. For brevity, a half-circuit representation is used, wherein a circuit block pertaining to a half circuit is labeled with a suffix "h," a circuit block pertaining to a common-mode network is labeled with a suffix "cm," and suffixes "p" and "n" are no longer used. For instance, amplifier $100h$ of FIG. 1B is a half-circuit representation of amplifier 100 of FIG. 1A; gain device $120h$ is a half-circuit representation of gain device 120 of FIG. 1A; and load $130h$ is a half-circuit representation of load 130 of FIG. 1A.

Figure 2A:
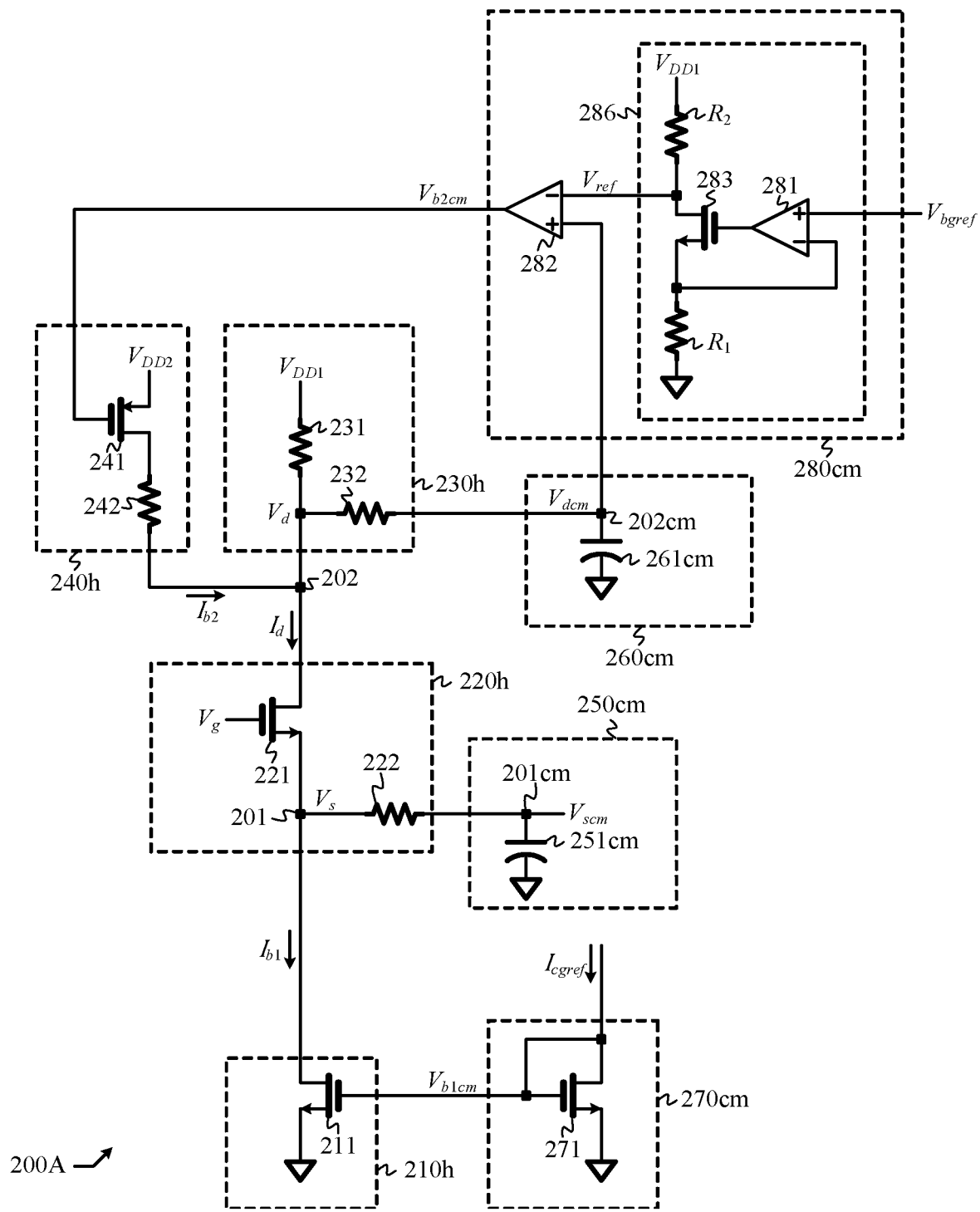
FIG. 2A shows a schematic diagram of an amplifier in accordance with an embodiment of the present disclosure.

A schematic diagram of an amplifier 200A, in a half-circuit representation, in accordance with an embodiment of the present invention, is shown in FIG. 2A. Amplifier 200A comprises: a first current source $210h$, comprising a NMOS transistor 211, configured to pull a first bias current $I_{b1}$ from a source node 201 in accordance with a first bias voltage $V_{b1cm}$; a common-source gain device $220h$, comprising a NMOS transistor 221 and a source-degenerating resistor 222, configured to receive an input voltage $V_g$ and pull an output current $I_d$ from a drain node 202 in accordance with a biasing condition determined by the first bias current $I_{b1}$ output from the source node 201, wherein the source-degenerating resistor 222 connects the source node 201 to a first common-mode node "$201cm$," resulting in a first common-mode voltage $V_{scm}$; a load $230h$ utilized to provide a termination to the drain node 202, the load $230h$ comprising a pull-up resistor 231 configured to pull up the drain node 202 to a first power supply node "$V_{DD1}$" and a common-mode sensing resistor 232 configured to couple the drain node 202 to a second common-mode node "$202cm$," resulting in a second common-mode voltage $V_{dcm}$; a second current source $240h$ comprising a PMOS (p-channel metal oxide semiconductor) transistor 241 and an isolation resistor 242 configured to output a second bias current $I_{b2}$ flowing from a second power supply node "$V_{DD2}$" to the drain node 202 in accordance with a second bias voltage $V_{b2cm}$; a first common-mode network $270cm$ configured to establish the first bias voltage $V_{b1cm}$ in accordance with a "constant-gm" reference current $k_{cgref}$; and a second common-mode network $280cm$ configured to receive the second common-mode voltage $V_{dcm}$ at the second common-mode node $202cm$ and output the second bias voltage $V_{b2cm}$ in accordance with a bandgap reference voltage $V_{bgref}$.

In some embodiments, amplifier 200A further includes a shunt capacitor $251cm$ (shown inside box $250cm$) configured to provide low-pass filtering on the first common-mode voltage $V_{scm}$ so that $V_{scm}$ is substantially equal to a mean value of $V_s$. In an embodiment, shunt capacitor $251cm$ comprises a parasitic capacitor.

In some embodiments, amplifier 200A further includes a shunt capacitor $261cm$ (shown inside box $260cm$) configured to provide low-pass filtering on the second common-mode voltage $V_{dcm}$ so that $V_{dcm}$ is substantially equal to a mean value of $V_d$. In an embodiment, shunt capacitor $261cm$ comprises a parasitic capacitor.

The isolation resistor 242 is introduced to provide isolation between the drain terminal of PMOS transistor 241 and the drain node 202 to alleviate an effect of a parasitic capacitance of PMOS transistor 241 on the drain node 202. Otherwise, said parasitic capacitance can adversely introduce a large capacitive load at the drain node 202.

In some embodiments, a bandgap reference voltage $V_{bgref}$ is approximately 1.23V and is highly accurate and insensitive to temperature; this is well known in the prior art and thus not described in detail here.

The second common-mode network $280cm$ comprises: a voltage scaling circuit 286 configured to receive the bandgap reference voltage $V_{bgref}$ and output a scaled reference voltage $V_{ref}$ and an operational amplifier 282 configured to output the second bias voltage $V_{b2cm}$ in accordance with a difference between $V_{dcm}$ and $V_{ref}$. The load $230h$, the second common-mode network $280cm$, and the second current source $240h$ form a negative feedback loop. When $V_{dcm}$ is higher (lower) than $V_{ref}$, operational amplifier 282 will force $V_{b2cm}$ to rise (fall), causing PMOS transistor 241 to decrease (increase) $I_{b2}$ and consequently causing $V_d$ and thus $V_{dcm}$ to fall (rise). This negative feedback loop thus can force $V_{dcm}$ to track $V_{ref}$, i.e., $$V_{dcm} = V_{ref} \quad (1)$$

The voltage scaling circuit 286 comprises an operation amplifier 281, a NMOS transistor 283, and two resistors $R_1$ and $R_2$ configured in a negative feedback topology so that $$V_{DD1} - V_{ref} = V_{bgref} \cdot \frac{R_2}{R_1}. \quad (2)$$

The voltage scaling circuit 286 is an operational-amplifier-based feedback circuit widely used in the prior art, and how equation (2) can be derived is apparent to those of ordinary skill in the art. Therefore, the derivation is not explained in detail here.

Combining equations (1) and (2), provides:

$$V_{DD1} - V_{dcm} = V_{bgref} \cdot \frac{R_2}{R_1}. \quad (3)$$

As mentioned earlier, $V_{dcm}$ is equal to a mean value of $V_d$. Since $V_d$ can swing high up to "$V_{DD1}$," $V_{DD1} - V_{dcm}$ is an available swing for $V_d$. Since $V_{bgref}$ is a highly accurate and insensitive to temperature, as is $R_2/R_1$, the available output swing of amplifier 200A thus can be highly accurate and insensitive to temperature or temperature changes.

A "constant-gm" current is a current that, when it is used to bias a transistor, the transistor can have a transconductance that is highly accurate and insensitive to temperature. The first common-mode network 270cm comprises a NMOS transistor 271 configured in a diode-connect topology to receive the current-gm reference current $I_{cgref}$ and convert it to the first bias voltage $V_{b1cm}$ to control NMOS transistor 211. NMOS transistors 271 and 211 form a current mirror, so that $I_{b1}$ is a current scaled from $I_{cgref}$ with a scaling factor determine by a ratio between the width-to-length ratio of NMOS transistor 211 and the width-to-length ratio of NMOS transistor 271. Therefore, $I_{b1}$ is also a constant-gm current. As a result of being biased by a constant-gm current, the common-source gain device 220h can have a transconductance that is highly accurate and insensitive to temperature. As a result, a gain of amplifier 200A can be highly accurate and insensitive to temperature.

In conclusion, the gain of amplifier 200A can be highly accurate and insensitive to temperature due to using the first common-mode network 270m, while the available output swing of amplifier 200A can be highly accurate and insensitive to temperature due to using the second common-mode network 280cm.

In some embodiments, the PMOS transistor 241 is replaced by an NMOS transistor, and the input polarity of the operational amplifier 282 is swapped. In such a configuration, the load 230h, the second common-mode network 280cm, and the second current source 240h still form a negative feedback loop, and the available output swing of amplifier 200A can still be highly accurate and insensitive to temperature.

Note that the source-degenerating resistor 222 can also fulfill a function of common-mode sensing. Also, in a special case, the source-degenerating resistor 222 is 0-Ohm, i.e., a short circuit.

Figure 2B:
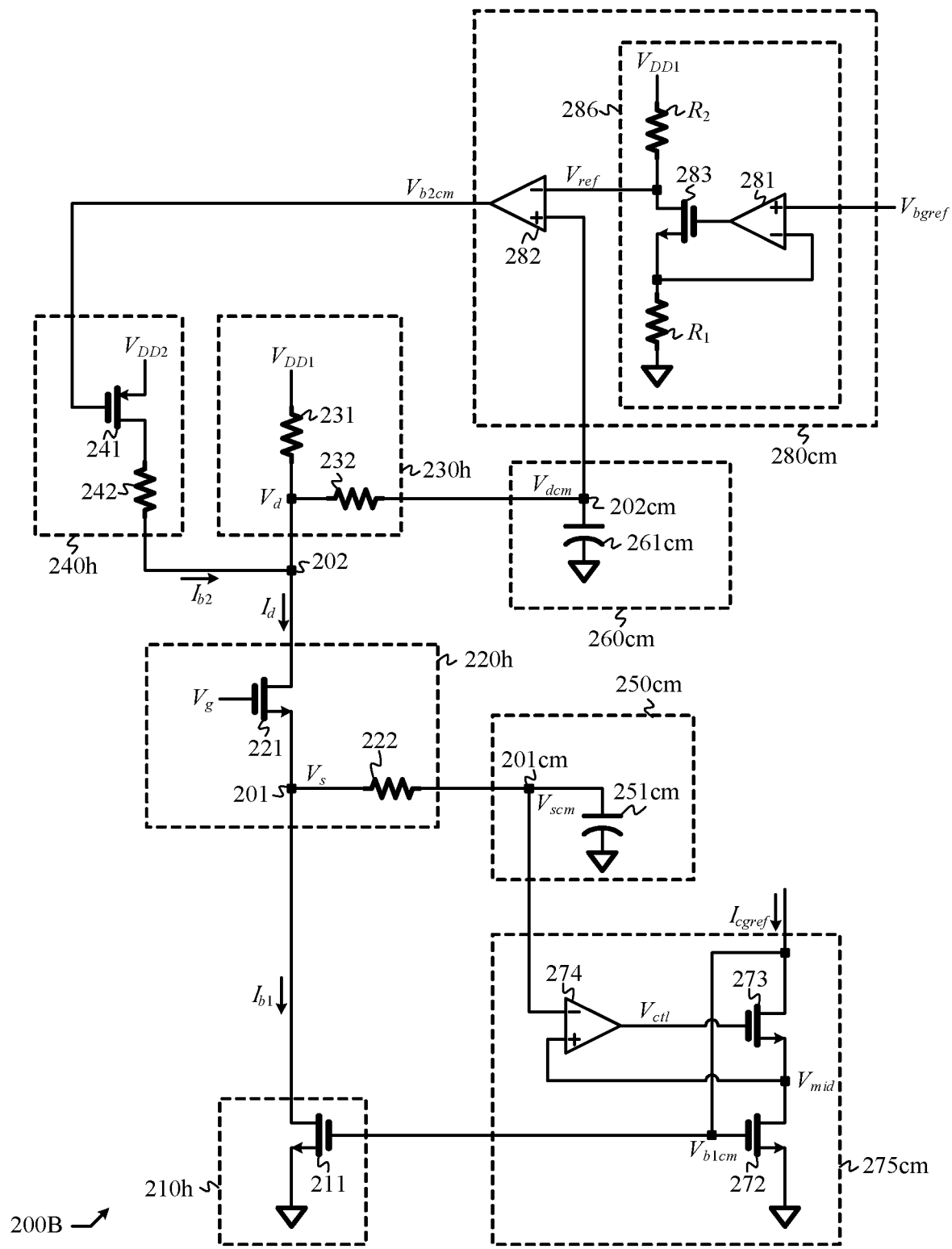
FIG. 2B shows a schematic diagram of an alternative embodiment of the amplifier of FIG. 2A.

An accuracy of the current mirror embodied by NMOS transistors 271 and 211, however, may be subject to degradation due to channel length modulation of NMOS transistor 211. For instance, if a mean voltage of $V_s$ is lower (higher) than the first bias voltage $V_{b1cm}$, the first bias current $I_{b1}$ will be lower (higher) than expected from ideal current mirroring, since a drain-to-source voltage of NMOS transistor 211 is lower (higher) than a drain-to-source voltage of NMOS transistor 271. A mean value of $V_s$ is sensed by the source-degenerating resistor 222 and represented by the first common-mode voltage $V_{scm}$ at the first common-mode node 201cm. To mitigate the effect of channel length modulation of NMOS transistor 211, an alternative embodiment 200B as shown in FIG. 2B can be implemented. The alternative embodiment 200B is the same as amplifier 200A of FIG. 2A except that common-mode network 270cm in FIG. 2A is replaced by an alternative common-mode network 275cm in FIG. 2B. The alternative common-mode network 275cm comprises: a first NMOS transistor 272 configured in a common-source topology, a second NMOS transistor 273 configured in a cascode topology, and an operational amplifier 274. NMOS transistor 272 is used to establish the first bias voltage $V_{b1cm}$, and together with NMOS transistor 211 form a current mirror. NMOS transistor 273 is a cascode device used to pass the constant-gm reference current $I_{cgref}$ to NMOS transistor 272. Operational amplifier 274 outputs a control voltage $V_{ctl}$ in accordance with a difference between $V_{mid}$ (which is a voltage at the drain of NMOS transistor 272) and $V_{scm}$, wherein the control voltage $V_{ctl}$ controls a gate terminal of NMOS transistor 273. When the mean voltage of $V_s$ is higher (lower) than $V_{mid}$, operational amplifier 274 will force $V_{ctl}$ to fall (rise), causing $V_{b1cm}$ to rise (fall) due to an inverting function of NMOS transistor 273 and consequently causing the mean voltage of $V_s$ to fall (rise) due to an inverting function of NMOS transistor 211. The alternative common-mode network 275cm thus embodies a negative feedback to adjust the first bias voltage $I_{b1cm}$, to force a mean voltage of $V_s$ to be equal to $V_{mid}$; as a result, NMOS transistors 272 and 211 not only have the same gate-to-source voltage but also can have the same drain-to-source voltage, thus eliminating the inaccuracy of current-mirroring due to channel length modulation and allowing a highly accurate current mirroring.

Figure 3:
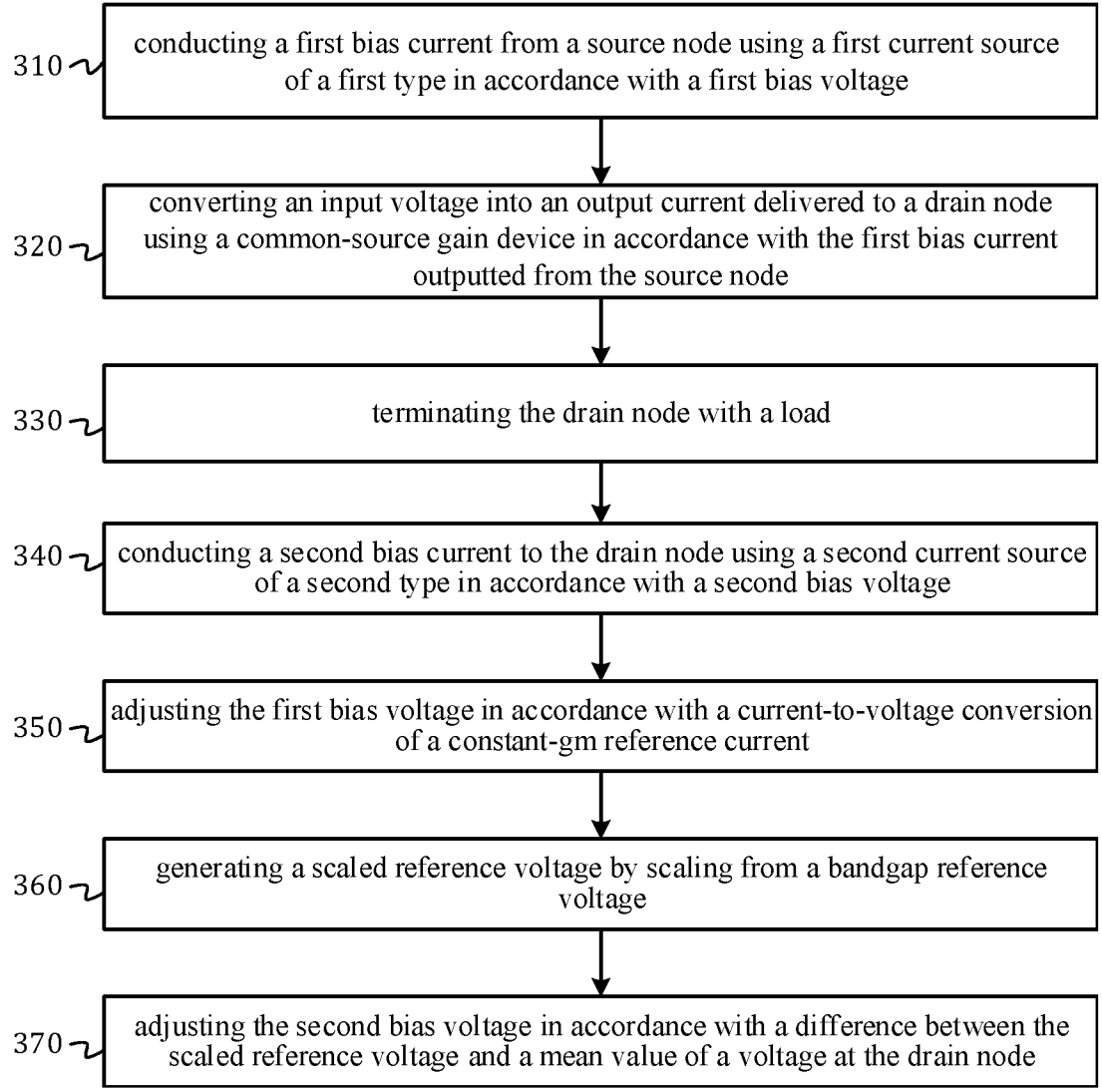
FIG. 3 shows a flow diagram of a method in accordance with an embodiment of the present disclosure.

As illustrated by a flow diagram shown in FIG. 3, a method in accordance with an embodiment of the present disclosure comprises the following steps: (step 310) conducting a first bias current from a source node using a first current source of a first type in accordance with a first bias voltage; (step 320) converting an input voltage into an output current delivered to a drain node using a common-source gain device in accordance with the first bias current outputted from the source node; (step 330) terminating the drain node with a load; (step 340) conducting a second bias current to the drain node using a second current source of a second type in accordance with a second bias voltage; (step 350) adjusting the first bias voltage in accordance with a current-to-voltage conversion of a constant-gm reference current; (step 360) generating a scaled reference voltage by scaling from a bandgap reference voltage; and (step 370) adjusting the second bias voltage in accordance with a difference between the scaled reference voltage and a mean value of a voltage at the drain node.

Note that a power supply node is considered as a DC (direct current) node since a voltage at a power node is substantially stationary. Likewise, a ground node is also a DC node.

Those skilled in the art will readily observe that numerous modifications and alterations of the device and method may be made while retaining the teachings of the invention. Accordingly, the above disclosure should not be construed as limited only by the metes and bounds of the appended claims.

What is claimed is:

1. A circuit comprising:
   a first current source of a first type configured to pull a first bias current from a source node in accordance with a first bias voltage;
   a common-source gain device configured to receive an input voltage and output an output current to a drain node in accordance with the first bias current outputted from the source node;
   a load configured to provide a termination to the drain node;
   a second current source of a second type configured to output a second bias current to the drain node in accordance with a second bias voltage;
   a first common-mode network configured to output the first bias voltage in accordance with a constant-gm reference current; and
   a second common-mode network configured to output the second bias voltage in accordance with a difference between a mean value of a voltage at the drain node and a scaled reference voltage scaled from a bandgap reference voltage.

2. The circuit of claim 1, wherein the first common-mode network comprises a diode-connect transistor configured to establish the first bias voltage in accordance with a current-to-voltage conversion of the constant-gm reference current.

3. The circuit of claim 1, wherein the first common-mode network comprises: a common-source transistor, a cascode transistor, and an operational amplifier, wherein: the cascode transistor passes the constant-gm reference current to the common-source transistor; a feedback from a drain terminal of the cascode transistor to a gate terminal of the common-source transistor establishes the first bias voltage; and the operation amplifier outputs a control voltage to control a gate terminal of the cascode transistor in accordance with a difference between a voltage at the drain terminal of the common-source transistor and a mean value of a voltage at the source node.

4. The circuit of claim 1, wherein the second common-mode network comprises: a voltage scaling circuit configured to receive the bandgap reference voltage and output the scaled reference voltage; and a first operational amplifier configured to output the second bias voltage in accordance with a difference between the scaled reference voltage and the mean value of the voltage at the drain node.

5. The circuit of claim 4, wherein the voltage scaling circuit comprises: a transistor, a first resistor configured to connect a source terminal of the transistor to a first DC (direct current) node, a second resistor configured to connect a drain terminal of the transistor to a second DC node, and a second operational amplifier configured to output a control voltage to control a gate terminal of the transistor in accordance with a difference between the bandgap reference voltage and a voltage at the source terminal of the transistor.

6. The circuit of claim 5, wherein the scaled reference voltage is derived from the drain terminal of the transistor.

7. The circuit of claim 1, wherein the first current source of the first type comprises a transistor of a first type.

8. The circuit of claim 7, wherein a gate terminal of the transistor of the first type is controlled by the first bias voltage, and a drain terminal of the transistor of the first type connects to the source node.

9. The circuit of claim 1, wherein the second current source of the second type comprises a transistor and an isolation resistor.

10. The circuit of claim 9, wherein a gate terminal of the transistor of the second type is controlled by the second bias voltage and a drain terminal of the transistor of the second type connects to the drain node through the isolation resistor.

11. A method comprising:
    conducting a first bias current from a source node using a first current source of a first type in accordance with a first bias voltage;
    converting an input voltage into an output current delivered to a drain node using a common-source gain device in accordance with the first bias current output from the source node;
    terminating the drain node with a load;
    conducting a second bias current to the drain node using a second current source of a second type in accordance with a second bias voltage;
    adjusting the first bias voltage in accordance with a current-to-voltage conversion of a constant-gm reference current;
    generating a scaled reference voltage by scaling from a bandgap reference voltage; and
    adjusting the second bias voltage in accordance with a difference between the scaled reference voltage and a mean value of a voltage at the drain node.

12. The method of claim 11, wherein the current-to-voltage conversion comprises using a diode-connect transistor to establish the first bias voltage.

13. The method of claim 11, wherein adjusting the first bias voltage includes using a circuit comprising: a common-source transistor, a cascode transistor, and an operational amplifier, wherein the cascode transistor passes the constant-gm reference current to the common-source transistor; a feedback from a drain terminal of the cascode transistor to a gate terminal of the common-source transistor establishes the first bias voltage; and the operational amplifier outputs a control voltage to control a gate terminal of the cascode transistor in accordance with a difference between a voltage at the drain terminal of the common-source transistor and a mean value of a voltage at the source node.

14. The method of claim 11, wherein adjusting the second bias voltage comprises using a first operational amplifier configured to output the second bias voltage in accordance with a difference between the scaled reference voltage and the mean value of the voltage at the drain node.

15. The method of claim 14, wherein generating the scaled reference voltage comprise using a transistor, a first resistor configured to connect a source terminal of the transistor to a first DC (direct current) node, a second resistor configured to connect a drain terminal of the transistor to a second DC node, and a second operational amplifier configured to output a control voltage to control a gate terminal of the transistor in accordance with a difference between the bandgap reference voltage and a voltage at the source terminal of the transistor to generate the scaled reference voltage.

16. The method of claim 15, wherein the scaled reference voltage is derived from the drain terminal of the transistor.

17. The method of claim 11, wherein the first current source of the first type comprises a transistor of a first type.

18. The method of claim 17, wherein a gate terminal of the transistor of the first type is controlled by the first bias voltage, and a drain terminal of the transistor of the first type connects to the source node.

19. The method of claim 11, wherein the second current source of the second type comprises a transistor and an isolation resistor.

20. The method of claim 19, wherein a gate terminal of the transistor of the second type is controlled by the second bias voltage and a drain terminal of the transistor of the second type connects to the drain node through the isolation resistor.

* * * * *